United States Patent [19]

Warner et al.

[11] Patent Number: 5,108,027

[45] Date of Patent: Apr. 28, 1992

[54] FLIP CHIP SOLDER BOND STRUCTURE FOR DEVICES WITH GOLD BASED METALLIZATION

[75] Inventors: David J. Warner; Kim L. Pickering, both of Northampton; David J. Pedder, Warwickshire, all of England

[73] Assignee: GEC-Marconi Limited, Stanmore, England

[21] Appl. No.: 684,483

[22] Filed: Apr. 12, 1991

Related U.S. Application Data

[63] Continuation of Ser. No. 520,826, May 9, 1990, abandoned.

[30] Foreign Application Priority Data

May 16, 1989 [GB] United Kingdom ............... 8911147

[51] Int. Cl.⁵ ............................................. B23K 1/20
[52] U.S. Cl. ............................... 228/254; 228/263.12; 437/192
[58] Field of Search ................. 228/254, 263.12, 121, 228/123, 124, 180.2; 29/840; 437/190, 192, 209; 357/71

[56] References Cited

U.S. PATENT DOCUMENTS

| | | | |
|---|---|---|---|
| 3,392,442 | 7/1968 | Napier et al. | 228/123 |
| 4,273,859 | 6/1981 | Mones et al. | 437/190 |
| 4,510,514 | 4/1985 | Camlibel et al. | 437/190 |
| 4,772,935 | 9/1988 | Lawler et al. | 228/123 |
| 4,840,302 | 6/1989 | Gardner et al. | 228/123 |
| 4,907,734 | 3/1990 | Conru et al. | 228/123 |

FOREIGN PATENT DOCUMENTS

| | | | |
|---|---|---|---|
| 38096 | 11/1973 | Japan | 437/190 |
| 48670 | 5/1978 | Japan | 437/190 |
| 68654 | 5/1980 | Japan | 437/190 |
| 71023 | 5/1980 | Japan | 437/190 |
| 253940 | 10/1989 | Japan | 437/190 |

OTHER PUBLICATIONS

IBM Technical Disclosure Bulletin, "Stable Junctions . . . Diffusion Barriers", vol. 21, No. 4, p. 1753, Sep. 1978.

*Primary Examiner*—Samuel M. Heinrich
*Attorney, Agent, or Firm*—Fleit, Jacobson, Cohn, Price, Holman & Stern

[57] ABSTRACT

A flip-chip solder bonding arrangement including a semiconductor substrate having thereon layers of metallization which have a tendency to interact with a solder material, forming on said layers of metallization a barrier metallization layer which is not reactive with said solder material, forming solder pads on the barrier layer and thereafter forming solder bonds with such solder pads employing said solder material.

2 Claims, 2 Drawing Sheets

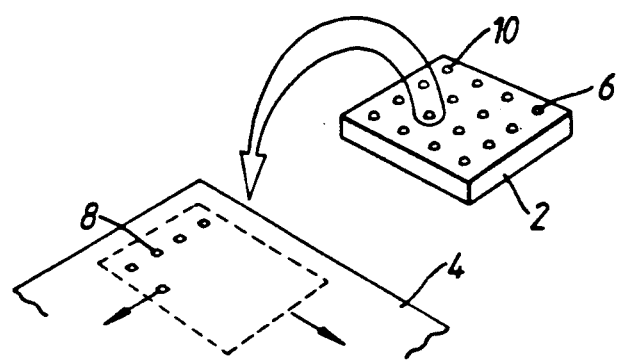
Fig.1a.
Fig.1b.
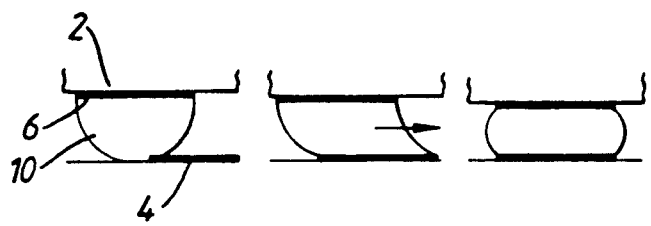
Fig.2.
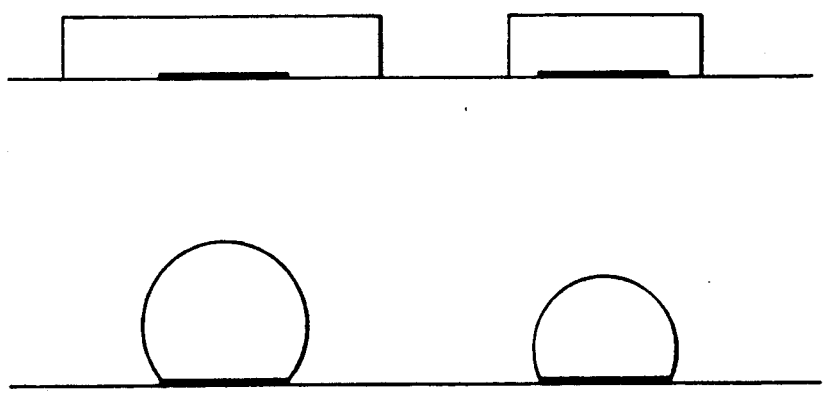
Fig.3.

FLIP CHIP SOLDER BOND STRUCTURE FOR DEVICES WITH GOLD BASED METALLIZATION

This is a continuation of application Ser. No. 07/520,826, filed May 9, 1990, now abandoned.

The present invention relates to a flip-chip solder bond arrangement.

Flip-chip solder bonding is now attracting significant attention as a means of providing very high density, area interconnections between a chip and a substrate, as a bonding technique with very attractive electrical characteristics (low inductance and capacitance) for high speed electronic devices and as a method of achieving very precise alignment and separation of components for micro-optical or related application. Examples of specific applications include solder bonded thermal detector - silicon circuit hybrids for IR detection and imaging, high 'lead' count VLSI silicon ICs, flip-chip bonded GaAs devices for microwave applications and solder bonded, V-grooved silicon micro-benches for optical fibre alignment to an integrated optics (LiNbO$_3$) substrate.

These devices all basically involve a 'chip' component and a 'substrate' component, both of which are provided with mating arrays of solderable metallisation pads (typically using CrCuAu multilayer metallisation), and either or both of which are provided with solder bumps over the solderable pads (typically using 95Pb:5Sn or 63Sn:37Pb solder (wt. %) as illustrated schematically in FIG. 1.

Referring to FIG. 1 an integrated circuit chip 2 and a substrate component 4 (which may itself be a chip) each of which having on one surface thereof a registering array of solderable metallisation pads 6, 8, and either or both of which are provided with solder bumps 10 over the solderable pads. To bond the two components, the components 2, 4 are first aligned to within the accuracy required for the solder bumps 10 to contact the corresponding wettable pad 8 or bumps (within $-\frac{1}{2}$ a pad diameter). The assembly is then raised above the melting point of the solder involved under inert or reducing conditions. The solder wets the wettable metallisation and surface tension forces then act to pull the two components into very accurate final alignment. The bonded assembly is then cooled to form a solidly bonded hybrid device structure. The final, equilibrium bond shape and spacing of the two components is controlled by the balance of surface tension and gravitational forces at the bonding temperature, and can readily be calculated for a regular array of circular bonds, knowing the individual solder bump volumes, wettable pad sizes, chip mass and solder surface tension. For large bond arrays with circular wettable pads and for low chip masses, the final solder bond geometry is that of a double truncated sphere, making calculation particularly straight forward. The process of bonding is illustrated schematically in FIG. 2.

It should be noted that the solder to form the bumps may be applied over areas larger than that of the wettable metallisation, using a variety of masking techniques, to provide a controlled 'dewet' ratio and allow independent control of solder bump heights from a uniform solder coating thickness, as illustrated in FIG. 3.

The use of 'dewet' has previously meant that the deposited solder has been in contact with aluminium or similar non-wettable metallisation, polyimide or oxide passivation, from all of which dewetting can take place.

However, recent work concentrating on the flip-chip bonding of III-V semiconductor devices onto ceramic substrates, using gold for low resistance microstrip tracks on device and substrate, has posed some problems.

Gold is employed in such devices since it is untarnishable, uncorrodable and highly reliable and is therefore preferred since such devices are often employed for military applications where high precision is required.

Attempts at reflow and bonding with solder in contact with gold would lead to metallurgical interactions (gold in contact with a 95% lead-tin solder would produce low melting point phases) producing an ill-defined solder contact area and a decrease in the volume of solder forming the truncated sphere, resulting in a disastrous loss of control of bump height.

Metallurgical interaction would also bring about a change in track geometry and the potential for formation of gold-tin intermetallics, lower melting point gold-lead phases and for joint embrittlement.

The present invention provides a flip-chip solder bonding arrangement including a semiconductor substrate having thereon layers of metallisation which have a tendency to interact with a solder material, forming on said layers of metallisation a barrier metallisation layer which is not reactive with said solder material, forming solder pads on the barrier layer and thereafter forming solder bonds with such solder pads employing said solder material.

Thus in a preferred arrangement layers of metallisation are formed of gold on III-V semiconductor components and a barrier layer preferably of chromium is formed on the metallisation layers. The barrier layer is arranged so that its area is larger than the intended area for solder deposition.

Although the invention is principally concerned with gold, the present invention could equally well be applied to metallisation layers of silver and copper which have similar metallurgical properties to gold. The problem does not usually arise with aluminium which is normally used for metallisation layers since aluminium will naturally form a self protective oxide coating.

Chromium is preferred for the barrier material, but other materials could be employed, for example titanium, tungsten, or mixtures thereof, in particular titanium-tungsten.

A preferred embodiment of the invention will now be described with reference to the accompanying drawings wherein:

FIGS. 1a and 1b show a schematic diagram of the known flip-chip solder bonding process;

FIG. 2 is a schematic view illustrating how a solder bump performs a self-aligning procedure during the formation of the solder bond;

FIG. 3 illustrates a method by which the height of a solder bond is controlled;

Figure 4:
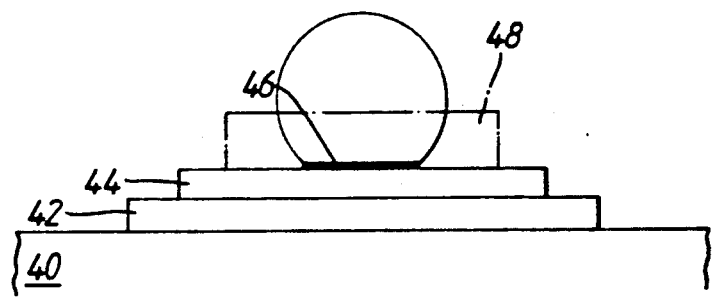
FIG. 4 illustrates a structure in accordance with a preferred embodiment of the invention; and, FIG. 5 shows a completed solder bond with two such structures as shown in FIG. 4.

Referring now to the drawings, FIG. 4 shows a preferred embodiment of the invention wherein a substrate 40 of gallium arsenide has formed thereon gold metallisation layers 42. A barrier layer 44 of solder-inert material in this instance chromium, 44 is formed on gold layer 42. A solder wettable pad 46 is formed on barrier layer 44. Solder pad 46 forms one pad of an array of pads positioned over the substrate 40, and a corresponding barrier layer portion 44 is provided, disposed beneath each pad 46. A solder bump 48 of 95% lead, 5% tin composition is formed on solder pad 46. As shown in dotted lines, solder bump 48 in its initial state overlaps the solder pad 46 in order to provide a solder bump of the required dimensions. The solder bump is shown in full lines after it has been reflowed to make a solder bond where it has roughly the shape of a sphere extending from the solder pad 46. It will be understood that the material of the barrier layer, chromium, is non-wettable and therefore permits the use of different "dewet" ratios to achieve solder bump height control.

Figure 5:
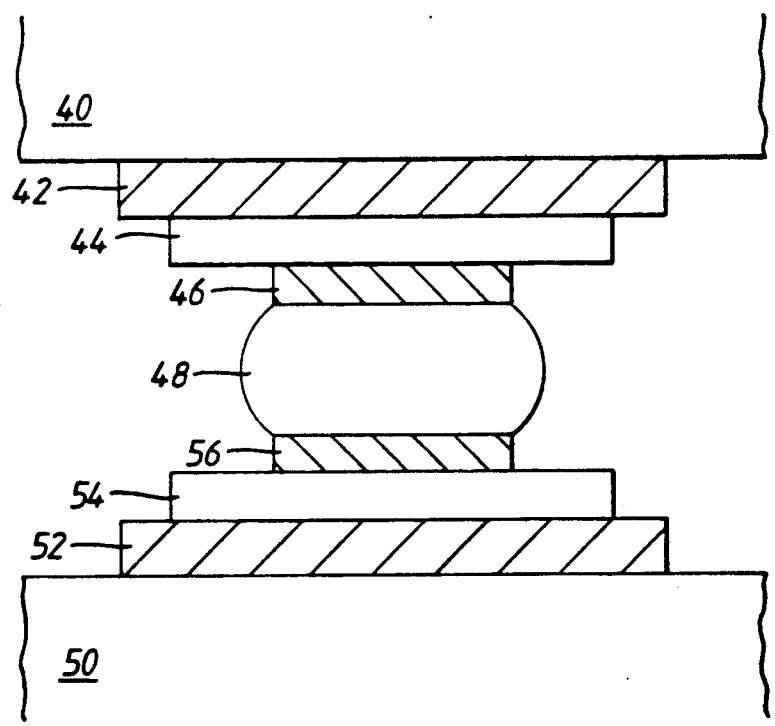

A completed solder bond is shown in FIG. 5 wherein the structure of FIG. 4 is connected via solder bump 48 to a similar structure having a ceramic substrate 50, metallisation layers 52 of gold, a barrier metal layer 54 of chromium, and a solder pad 56.

A further criterion on the dimension of the barrier metallisation area is concerned with the alignment stage of flip-chip bonding process. The barrier metallisation must be of sufficient area to prevent the solder bump on one component being in contact with gold tracks on the other component. This area is thus defined by the precision of the bonding and alignment equipment employed.

To be effective as a barrier layer, the material must not interact with solder, be producible in pin-hole free layers, and act as a good diffusion barrier to solder. The barrier layer must also be nonwettable to solder, so that dewetting can take place.

Chromium has been found to be effective as a barrier layer. This can be evaporated or sputtered, sputtering being the preferred method as it gives better low stress cover, good topography step coverage and good adhesion. Titanium may be a suitable alternative barrier metallisation to Cr.

Utilisation of barrier metal technology has meant that it has been possible to exploit flip-chip solder bonding for MMIC devices where Au is used as a track material. Working devices have been produced by flip-chip bonding a GaAs IC containing active elements, to hybrid circuits on alumina and other microwave ceramic substrates carrying interconnects and frequency selective elements.

We claim:

1. A method of making a flip-chip solder bonding device, comprising the steps of:
   providing a semiconductor substrate;
   forming on said substrate a metallization layer of a metal selected from the group consisting of gold, silver and copper;
   forming on said metallization layer a barrier layer of a solder non-wettable metal selected from the group consisting of chromium, titanium, tungsten and titanium-tungsten;
   forming solder wettable pads on the barrier layer; and thereafter forming solder bumps of a solder material on said solder wettable pads.

2. The method of claim 1, further comprising the step of providing a separate barrier metallization portion of said solder non-wettable metal for each solder wettable pad of an array of solder wettable pads formed on the substrate, each barrier metallization portion being dimensioned so as to receive the solder wettable pad and a solder bump formed thereon, which may have greater lateral dimensions than the respective solder wettable pad.

* * * * *